(12) United States Patent
Ming et al.

(10) Patent No.: US 7,714,949 B2
(45) Date of Patent: May 11, 2010

(54) TFT LCD ARRAY SUBSTRATE AND MANUFACTURING METHOD THEREOF

(75) Inventors: Xing Ming, Beijing (CN); Mi Zhang, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 178 days.

(21) Appl. No.: 11/926,303

(22) Filed: Oct. 29, 2007

(65) Prior Publication Data

US 2008/0100766 A1    May 1, 2008

(30) Foreign Application Priority Data

Oct. 27, 2006    (CN) .................. 2006 1 0149884

(51) Int. Cl.
*G02F 1/136* (2006.01)

(52) U.S. Cl. .................. 349/42; 349/43; 349/46; 349/47

(58) Field of Classification Search .................. 349/42, 349/43, 46, 47
See application file for complete search history.

(56) References Cited

U.S. PATENT DOCUMENTS

| 5,339,181 | A  |    | 8/1994  | Kim et al. |
|-----------|----|----|---------|------------|
| 5,517,342 | A  |    | 5/1996  | Kim et al. |
| 5,767,926 | A  |    | 6/1998  | Kim et al. |
| 5,844,641 | A  |    | 12/1998 | Jun et al. |
| 6,022,753 | A  |    | 2/2000  | Park et al. |
| 6,040,882 | A  |    | 3/2000  | Jun et al. |
| 6,795,151 | B2 |    | 9/2004  | Lee |
| 7,130,000 | B2 |    | 10/2006 | Kim |
| 2004/0080700 | A1 | * | 4/2004 | Kang ................. 349/141 |
| 2004/0090566 | A1 | * | 5/2004 | Jung et al. ............ 349/43 |
| 2004/0125300 | A1 | * | 7/2004 | Lee ................... 349/141 |
| 2004/0150779 | A1 | * | 8/2004 | Kim et al. ............ 349/141 |
| 2008/0117347 | A1 | * | 5/2008 | Zhang et al. .......... 349/42 |

FOREIGN PATENT DOCUMENTS

| CN | 1497311 A | 5/2004 |
|----|-----------|--------|
| CN | 1567074 A | 1/2005 |

\* cited by examiner

*Primary Examiner*—Frank G Font
*Assistant Examiner*—Mary A El Shammaa
(74) *Attorney, Agent, or Firm*—Hasse & Nesbitt LLC; Daniel F. Nesbitt

(57) ABSTRACT

A TFT LCD array substrate and manufacturing method thereof are provided. In the TFT LCD array substrate, a part of the drain electrode of the thin film transistor that is connected with the pixel electrode is overlapped with the common electrode that is formed to increase the storage capacity for the respective pixel area. The TFT LCD of the present invention increases the aperture ratio of the pixel area.

16 Claims, 4 Drawing Sheets

Forming a gate line and a gate electrode

Forming a gate insulating layer and an active layer forming a metal electrode layer forming a passivation layer forming a pixel electrode

TFT LCD ARRAY SUBSTRATE AND MANUFACTURING METHOD THEREOF

FIELD OF THE INVENTION

The present invention relates to a thin film transistor liquid crystal display (TFT LCD) and, in particular, to an array substrate of a TFT LCD and the manufacturing method thereof.

BACKGROUND OF THE INVENTION

Among the various flat panel displays, the TFT LCD is dominating the flat panel display market due to lower power consumption, relatively low manufacturing cost, and no radiation. The TFT LCD device is formed by assembling an array substrate and a color filter substrate with a liquid crystal layer interposed therebetween.

FIG. 1A is a top plan view of one pixel of a conventional amorphous silicon TFT LCD array substrate, and FIG. 1B is a cross-sectional view taken along the line A-A in FIG. 1A. This array substrate comprises: a plurality of gate lines 1 and a plurality of data lines 5 perpendicular to the gate lines 1. The adjacent gate lines and data lines define a pixel area. Each pixel area comprises a TFT as a switching device, a transparent pixel electrode 10, and a part of the common electrode 11. The TFT employs a bottom gate structure by a back channel etched as shown. The TFT comprises a gate electrode 2, a gate insulating layer 4, an active layer 3, a source electrode 6, and a drain electrode 7, as shown in FIG. 1B. A passivation layer 8 covers the above-mentioned components, and a passivation layer via hole 9 is formed in the passivation layer 8 over the drain electrode 7. The transparent electrode 10 is connected with the drain electrode 7 of the TFT via the passivation layer via hole 9. The source electrode 6 is connected with one of the data lines 5. The part of the common electrode 11 forms a storage capacitor with the pixel electrode 10 by overlapping with the pixel electrode 10 (the projection portion in the pixel area). In order to further lower the light leakage within the pixel area, light blocking bars 12 are formed on both sides of the pixel electrode 10 parallel to the data lines 5 in the pixel area. The TFT device can reduce the light-induced leak current in the channel. The light blocking bars 12 are made of the same material as the gate electrode 12 in the same process.

The 5-Mask (photolithography) process as shown in FIG. 2 is a typical manufacturing technology for TFT LCD array substrate at present and mainly comprises the following five steps:

1). forming a gate electrode and gate line, and optionally forming light blocking bars and/or common electrodes simultaneously;
2). forming a gate insulating layer and an active layer;
3). forming a source electrode, a drain electrode, and a data line;
4). forming a passivation layer; and
5). forming a pixel electrode.

Each of the steps comprises three main processes, namely, thin film deposition, forming of the etching mask pattern (coating a photoresist layer, exposing with a mask plate, and developing), and etching. Each of the five steps uses a mask plate to pattern the respective deposited layer. The above process is typical for 5-Mask technology. Other 5-Mask technologies could also be employed by changing the mask plate design and the process flow.

In the TFT LCD array substrate shown in FIGS. 1A and 1B, since the drain electrode is always located in the pixel area, a part of the aperture ratio is always sacrificed, causing a decrease in the aperture ratio. A common method of improving the aperture ratio is to reduce the area occupied by the other components.

SUMMARY OF THE INVENTION

In view of the problems in the related art, the objects of the present invention are to overcome the defects in the related art by providing a TFT LCD array substrate and the manufacturing method thereof.

One object of the present invention is to decrease the pixel area occupied by the TFT by overlapping the common electrode with a part of the drain electrode of the TFT that is connected with the pixel electrode, so as to improve the aperture ratio. Another object of the present invention is to further increase the area of the storage capacitor by forming the light blocking bars in an integrated structure so as to reduce the voltage jumping. The common electrode and the light blocking bars may be formed in an integrated structure to increase the signal stability of the common electrode. Still another object of the present invention is to provide a simple repair method for the defective pixel as a bright dot in the array substrate.

In one aspect, the present invention provides a TFT LCD array substrate, comprising: a substrate; at least one gate line and at least one data line formed on the substrate and defining at least one pixel area; a pixel electrode formed in the pixel area; a thin film transistor formed in the pixel area and comprising a gate electrode as a part of the gate line, a source electrode connected with the data line, and a drain electrode connected with the pixel electrode; at least one common electrode formed on the substrate, wherein the part of the drain electrode connected with the pixel electrode is overlapped with the common electrode.

Preferably, the array substrate of a TFT LCD according to an embodiment of the present invention may further comprise a light blocking bar located at the periphery of the pixel electrode. The light blocking bar and the common electrode can be connected with each other as an integrated structure. The light blocking bar may extend parallel to the gate line or the data line. For example, the light blocking bar may comprise a first light blocking bar that is parallel to the gate line and a second light blocking bar that is parallel to the data line. The first light blocking bar and the second light blocking bar may be connected with each other to form an integrated structure. The integrated structure may be a closed structure. A part of the pixel electrode can be disposed above the gate line so as to form a fusion portion.

In another aspect, the present invention provides a method of manufacturing a TFT LCD array substrate. The method includes the steps of depositing and patterning a gate metal film on a substrate so as to form a gate line and a common electrode, in which a part of the gate line serving as a gate electrode of a thin film transistor. Next, a gate insulating material film and an active material film are deposited sequentially, and the active material film is patterned so as to form an active layer of the thin film transistor. A second metal film is then deposited and patterned, so as to form a data line, a source electrode and a drain electrode of the thin film transistor, in which the source electrode and the drain electrode are spaced apart from each other and contact both ends of the active layer respectively. A passivation material film is then deposited and patterned so as to form a passivation layer via hole above the drain electrode. and depositing and patterning a pixel electrode film so as to form a pixel electrode connected with the drain electrode via the passivation layer via hole, wherein the passivation layer via hole is formed over the common electrode.

Preferably, the method of manufacturing the TFT LCD array substrate further comprises the step of forming a light blocking bar during formation of the gate line and common electrode. The light blocking bar will be on the periphery of the later formed pixel electrode. The light blocking bar and the common electrode can be connected with each other as an integrated structure. The light blocking bar may extend parallel to the gate line or the data line. For example, the light blocking bar may comprise a first light blocking bar that is parallel to the gate line and a second light blocking bar that is parallel to the data line. The first light blocking bar and the second light blocking bar can be connected to form an integrated structure. The integrated structure may be a closed structure. A part of the pixel electrode can be formed over the gate line as a fusion portion.

Compared with the TFT LCD array substrate in the related art, the source electrode and a part of the drain electrode of the TFT of the present invention can be disposed over the gate lines, while another part of the drain electrode and the passivation layer via hole, through which another part of the drain electrode is connected with the pixel electrode, are disposed over the common electrode without occupying the pixel area so as to increase the aperture ratio.

In addition, in an embodiment of the present invention, the number of light blocking bars may be increased, and the individual blocking bars may be connected together with the common electrode, to form a larger common electrode structure, so that the signal stability of the storage capacitor can be enhanced, the voltage jumping can be decreased, and the possibility of common electrode signal distortion can be decreased.

Furthermore, in an embodiment of the present invention, it is possible to repair a defective pixel that appears as a bright dot in the array substrate in a relatively simple manner by fusing the electrode and gate line together at the fusion portion of the pixel electrode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter, and the accompanying drawings, which are given by way of illustration only and thus are not limitative and wherein.

DETAILED DESCRIPTION OF THE PREFERRED EMBODIMENTS

Exemplary embodiments of the present invention will be described hereinafter with reference to the accompanying drawings. It should be understood that in this description when a layer or a element is referred to as being "on" or "connected to" another layer or element, this layer or element can be directly on or directly connected to the other layer or element, or an intervening layer may also be present.

Figure 1A:
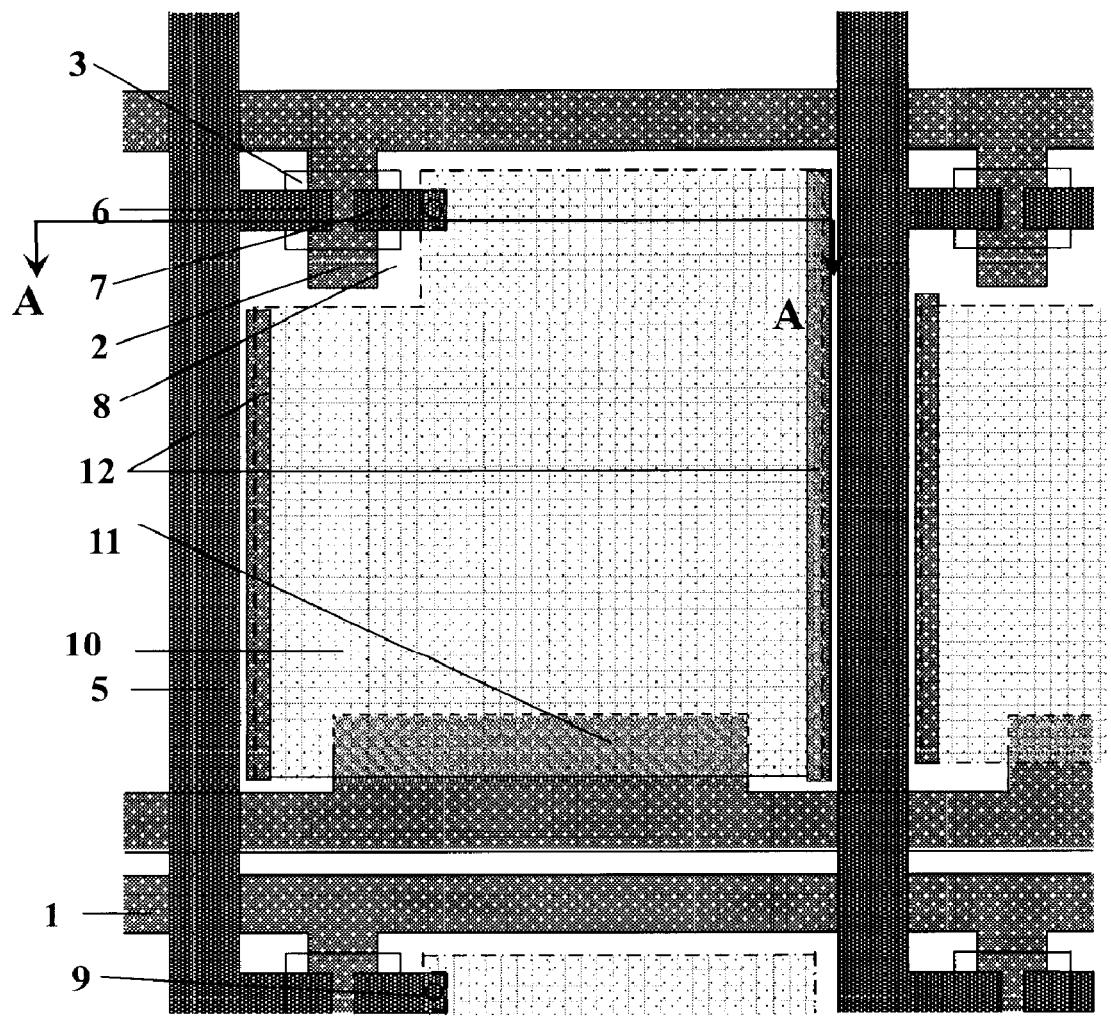
FIG. 1A is a top plan view of one pixel area of a conventional TFT LCD array substrate in the related art.
Figure 1B:
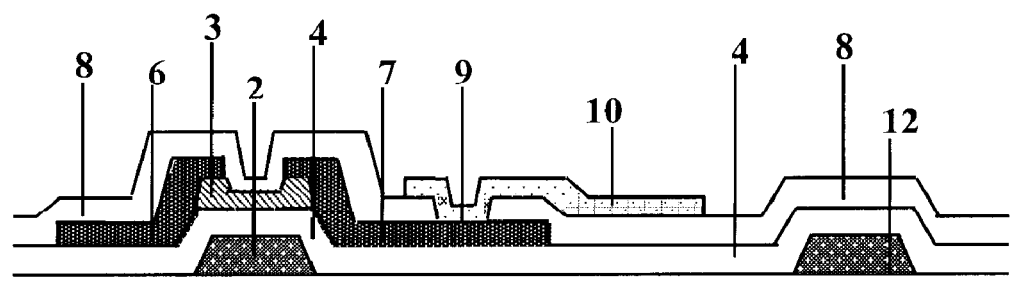
FIG. 1B is a partial cross-sectional view taken along the line A-A in FIG. 1A.
Figure 2:
FIG. 2 is a typical 5-Mask process flow chart in the related art.
Figure 2:
Figure 2:
Figure 2:
Figure 3A:
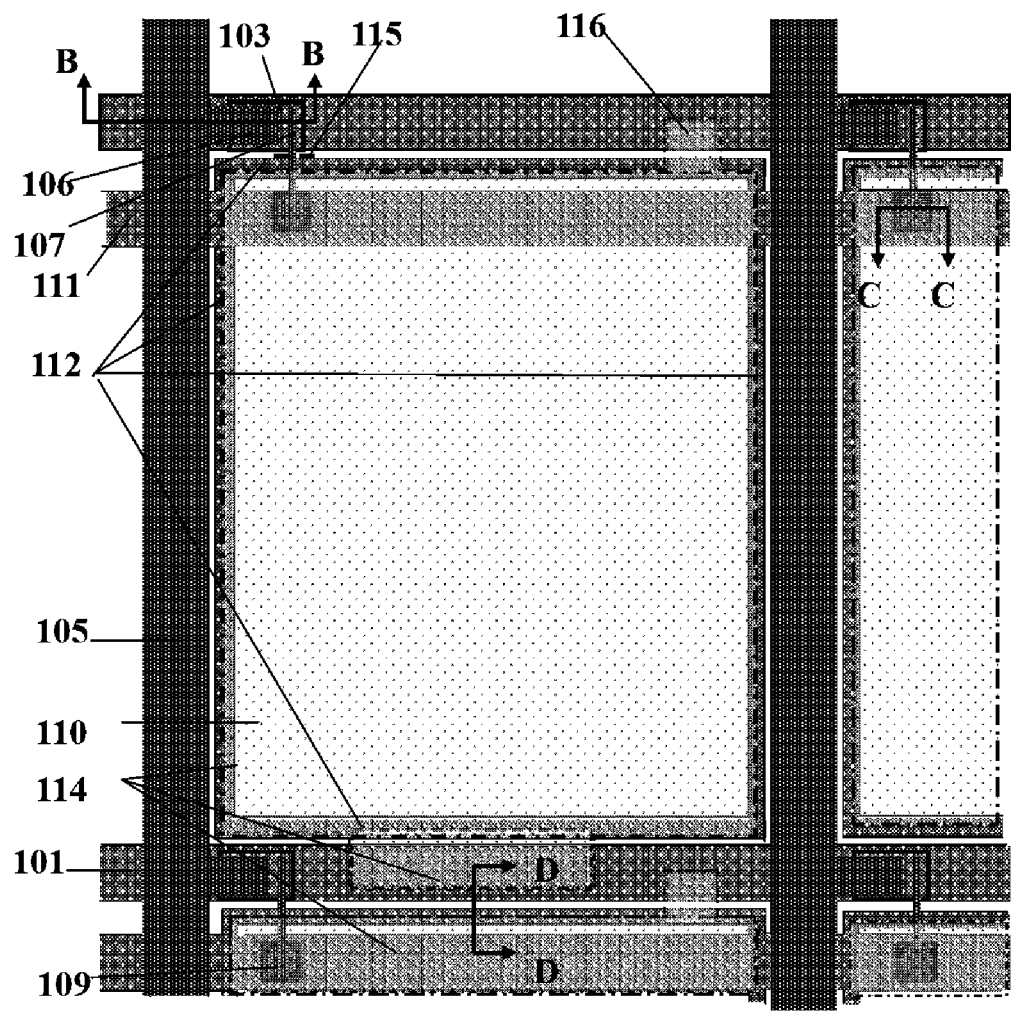
FIG. 3A is a top plan view of one pixel area of a TFT LCD array substrate according to an embodiment of the present invention.
Figure 3B:
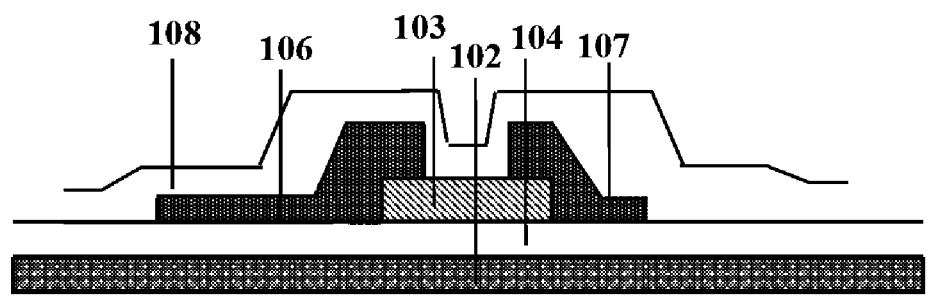
FIG. 3B is a cross-sectional view taken along the line B-B in FIG. 3A.
Figure 3C:
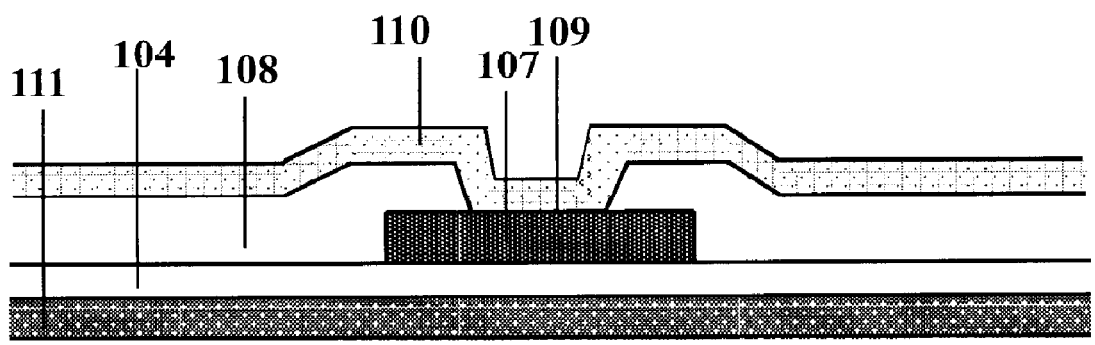
FIG. 3C is a cross-sectional view taken along the line C-C in FIG. 3A.

FIG. 3A is a top plan view of one pixel area of a TFT LCD array substrate according to an embodiment of the present invention. As shown in FIG. 3A, a plurality of gate lines 101, a plurality of data lines 105 perpendicular to the gate lines 101, and a plurality of common electrodes 111 parallel to the gate lines 101 are formed on the TFT LCD array substrate. The adjacent gate lines 101 and data lines 105 cross each other to define a pixel area, and one common electrode 111 goes through the pixel area. Each pixel area comprises a TFT, as a switching device, and a pixel electrode 110. As shown in FIG. 3B, the TFT comprises a gate electrode 102, a gate insulating layer 104, an active layer 103, a source electrode 106, and a drain electrode 107 that are sequentially formed on, for example, a glass substrate (not shown). The source electrode 106 and the drain electrode 107 of the TFT are spaced apart from each other and contact both ends of the active layer 103 respectively. The portion of the active layer 103 between the source electrode 106 and the drain electrode 107 serves as the channel of the TFT. A passivation layer 108 is formed on the above-mentioned components and covers them. As shown in FIG. 3C, the pixel electrode 110 is formed above the passivation layer 108, and is connected to a part of the drain electrode 107 via a passivation layer via hole 109 that is formed in the passivation layer 108 over a part of the drain electrode 107.

As shown in FIGS. 3A and 3B, in the pixel area of the TFT LCD array substrate the source electrode 106 and a part of the drain electrode 107 are disposed above the gate line 101 and spaced apart from each other. The gate electrode 102 is a part of the gate line 101. As shown in FIGS. 3A and 3C, the via hole 109 is also formed over the common electrode 111, and the drain electrode 107 of the TFT is connected with the pixel electrode 110 via this via hole 109.

As shown in FIG. 3A, the pixel area of the TFT LCD array substrate has four light blocking bars 112 (horizontal light blocking bars and vertical light blocking bars) interconnected to constitute a closed light blocking bar structure, which is formed at the periphery of the pixel electrode 110. The closed light blocking bar structure is connected with the common electrode 111 to constitute a larger common electrode structure. The closed light blocking structure is overlapped with the periphery of the pixel electrode 110, to not only block the light leakage in the pixel area, but also provide the supplemental storage capacitance. Such arrangement has the advantages of providing larger storage capacitance and improving the display quality.

A position, between the via hole 109 and the active layer 103, on the drain electrode 107 can be used for the cutting position 115 for repairing. A part of the pixel electrode 110 is, for example, disposed over the upper gate line 101 to form a fusion portion 116 for repairing as shown. FIG. 3A shows the cutting position 115 and the fusion portion 116 which are used when a defective pixel is repaired. When one pixel is found defective, for example, as being a bright dot, the drain electrode 107 can be cut off from the TFT with a laser at the cutting position 115, so that the pixel electrode 110 is no longer controlled by the TFT of the pixel. The pixel electrode 110 and the gate line 101 can then be fused together with the laser at the fusion portion 116, so that the potential of the pixel electrode 110 is controlled by the gate line 101.

In this embodiment, the common electrode 111 and one of the light blocking bars 112 can be formed as an integrated structure but not merged into one piece. In particular, the common electrode 111 and one of the light blocking bars 12 parallel to the gate lines 101 (for example the upper one) can be merged into one piece, so as to further enhance the aperture ratio of the pixel electrode. In addition, the common electrode 111 can be parallel to the gate line 101 as shown or, alternatively, be inclined with respect to the gate line 101 at an angle.

Furthermore, in the above embodiment, the gate line 101, the data line 105, the source electrode 106 and the drain electrode 107 of the thin film transistor, as well as the common electrode 111 and the light blocking bars 112, can be formed of a material selected from aluminum, chromium, tungsten, tantalum, titanium, molybdenum, aluminum-nickel and the combination thereof, in a layered structure, such as a single layer structure or a multi-layer structure. The gate line 101, the common electrode 111, and the light blocking bars 112 can be formed of the same material in the same process for patterning. Such process for patterning comprises film deposition, etching mask patterning, and etching (for example, dry etching or wet etching). The gate insulating layer 104 can be formed of silicon nitride or aluminum oxide. The pixel electrode 110 can be formed of a transparent conductive material such as, for example, indium tin oxide, indium zinc oxide, or aluminum zinc oxide, or can be formed of a metal such as, for example, aluminum, in the case of a reflective type LCD. The active layer 3 can be formed of a semiconductor material such as amorphous silicon or polysilicon.

Although the drain electrode of the TFT is described as being connected to the pixel electrode in the above embodiment, it should be appreciated by those skilled in the art that the source electrode and the drain electrode in the TFT are interchangeable, that is, the drain electrode can be connected to the data line while the source electrode is connected to the pixel electrode.

The pixel area arrangement in the embodiment described above is only one example of the present invention. Various changes in form and details can be made, such as connecting only the light blocking bars parallel to the data lines with the common electrode, connecting only the light blocking bars parallel to the gate lines with the common electrode, or connecting both the light blocking bars parallel to the gate lines and the light blocking bars parallel to the data lines to the common electrode.

The above TFT LCD array substrate according to the embodiment of the present invention can be manufactured by the following exemplary method.

First, a gate metal film is formed on a glass substrate in a thickness between 1000 Å and 7000 Å by a magnetron sputtering process for example. The material for the gate metal film may be made of a metal such as that selected from molybdenum, aluminum, aluminum nickel alloy, molybdenum tungsten alloy, chromium, copper and the combination thereof. Then, the patterning for the gate lines 101, the common electrode 111, and the light blocking bars 112 is performed on an area of the glass substrate by a photolithography process, using a gate mask plate and a chemical etching process. The gate lines 101, the common electrode 111, and the light blocking bars 112 have the same thickness and slope angle after the etching.

Thereafter, a gate insulating material film for the gate insulating layer in a thickness between 1000 Å to 6000 Å, and an active film such as an amorphous silicon film in a thickness between 1000 Å to 6000 Å, are successively deposited on the array substrate by a chemical vapor deposition (CVD) process for example. The material for the gate insulating material film may be one selected from silicon nitride, silicon oxide, and silicon oxynitride. The amorphous silicon film is patterned by etching using the mask plate for the active layer so as to form silicon islands. The gate insulating layer between the gate metal film and the amorphous silicon film serves as an etching stop. In the case of the polysilicon active layer, a crystallization process such as, for example, a thermal treatment or a laser annealing, can be performed on the amorphous silicon film to crystallize it so as to form a polysilicon film.

Next, a second metal film in a thickness between 1000 Å and 7000 Å, which can be similar to the gate metal film, is deposited on the array substrate by a method similar to that used for the gate metal film. Data lines 105, source electrode 106, and drain electrode 107 are formed on an area by patterning the second metal film using the mask plate for the data lines, source electrode, and the drain electrode.

Next, a passivation layer in a thickness between 1000 Å and 6000 Å is deposited on the array substrate for example by a CVD process. The material of the passivation layer can be selected from silicon nitride and aluminum oxide. At this time, the common electrode 111, the light blocking bars 112, and the gate lines 101 are covered with the same gate insulating layer 104 and the passivation layer 108. A passivation layer via hole 109 used for connecting a part of drain electrode 107 with the pixel electrode 110 is patterned over the common electrode 111 by photolithography, using the mask plate for the passivation layer and etching process, as shown in FIG. 3C. The via hole 109 is possible with variation regarding trench or other structures.

Figure 3D:
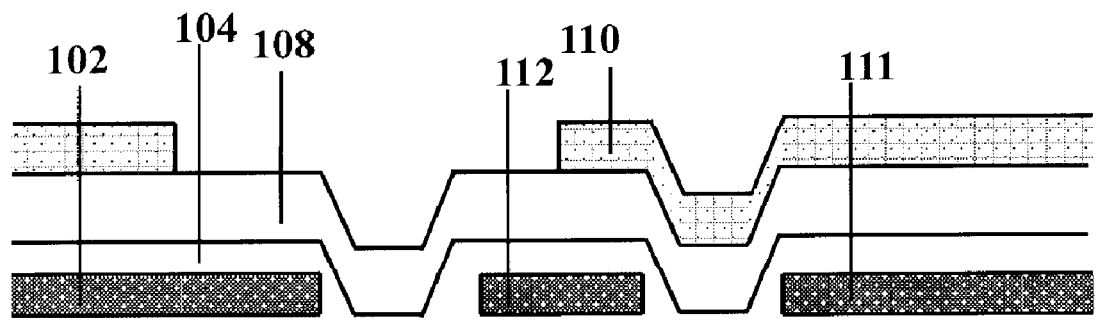
FIG. 3D is a cross-sectional view taken along the line D-D in FIG. 3A.

Finally, a pixel electrode film is deposited on the array substrate thus resulted, and the pixel electrode 110 is formed by patterning the pixel electrode film as above using the mask plate for the pixel electrode. At the same time, the storage capacitor 114 is formed with the pixel electrode 110 overlapping with the gate lines and/or the light blocking bars (as shown in FIG. 3D), and the fusion portion 116 is also formed as part of the pixel electrode over the gate line. The pixel electrode 110 and the drain electrode 107 are connected with each other via the passivation layer via hole 109. The typical materials for the pixel electrode film may be indium tin oxide, indium zinc oxide, or aluminum zinc oxide, in a thickness between 100 Å and 1000 Å.

In the above description, the bottom gate TFT is described as an example of a switching device for the pixel area, however it should be understood by those skilled in the art that the present invention can also be applied to the case where the switching element of the pixel is a top gate TFT, as long as the part of the drain electrode connected with the pixel electrode is overlapped with the common electrode. Preferably, the light blocking bars are formed under the periphery of the pixel electrode and, more preferably, the light blocking bars are formed together with the common electrode as an integrated structure. It is even more preferable that the light blocking bars be connected with each other to form an integrated structure such as a closed structure.

The configuration and manufacturing method of the top gate TFT are well known to those skilled in the art. For example, a conventional method for forming a pixel with a top gate TFT may comprise the steps of: forming an active layer on a substrate, forming a gate insulating layer on the active layer, forming a gate electrode and a gate line (also a common electrode and/or a light blocking bar, if needed) on the gate insulating layer, forming a second insulating layer over the gate electrode and the gate line, forming a source electrode and a drain electrode on the second insulating layer that are spaced apart from each other and connected with the active layer through via holes, forming a passivation layer on the source and drain electrodes, and forming a pixel electrode on the passivation layer that is connected with the drain electrode through a via hole, the detailed description of which is not given herein for simplicity. Also, in the pixel area with the top gate TFT, according to an embodiment of the present invention, a via hole, through which the drain electrode and the pixel electrode are connected, can be formed over the common electrode in the passivation layer.

The above embodiments are only exemplary implementations of the present invention. Other implementations for the present invention are also possible, such as 4-Mask and 3-Mask photolithography processes that use four and three mask plates, respectively. The present invention also can be implemented by selecting different materials or different combinations of the materials. Furthermore, it is apparent that various modifications and changes can be made to the structure of the TFT.

Although the present invention has been described in detail referring to the preferred embodiments, the above embodiments are used only for illustration and not for the purpose of limitation. Accordingly, it will be understood by those of ordinary skill in the art that it is possible to use other materials and equipments if necessary, and that various modifications or equivalent alterations may be made to the embodiments of the present invention without departing from the spirit and scope of the present invention as set forth in the following claims.

What is claimed is:

1. A thin film transistor (TFT) array substrate for a liquid crystal display (LCD) device assembled with the array substrate and a color filter substrate having a liquid crystal layer interposed therebetween, comprising:
    a substrate;
    at least one gate line and at least one data line formed on the substrate and defining at least one pixel area;
    a pixel electrode formed in the pixel area;
    a light blocking bar located at the periphery of the pixel electrode;
    a thin film transistor formed in the pixel area and comprising a gate electrode as a part of the gate line, a source electrode connected with the data line, and a drain electrode connected with the pixel electrode; and
    at least one common electrode formed on the substrate overlapped with the pixel electrode to form a storage capacitor with the pixel electrode, and wherein a part of the drain electrode at which the drain electrode is connected with the pixel electrode is overlapped with the common electrode;
    wherein the gate line, the common electrode, and the light blocking bar are formed of the same material in the same process.

2. The array substrate according to claim 1, wherein the light blocking bar and the common electrode are connected with each other as an integrated structure.

3. The array substrate according to claim 2, wherein the light blocking bar extends parallel to the gate line or the data line.

4. The array substrate according to claim 2, wherein the light blocking bar comprises:
    a first light blocking bar parallel to the gate line; and
    a second light blocking bar parallel to the data line.

5. The array substrate according to claim 4, wherein the first light blocking bar and the second light blocking bar are connected with each other to form a closed structure.

6. The array substrate according to claim 1, wherein the gate line, the data line, the source electrode and the drain electrode of the thin film transistor, the common electrode, and the light blocking bar are formed of a material selected from the group consisting of aluminum, chromium, tungsten, tantalum, titanium, molybdenum, aluminum-nickel or a combination thereof, and are formed in a structure selected from a single layer structure or a multi-layer structure.

7. The array substrate according to claim 1, wherein a fusion portion of the pixel electrode is formed over the gate line.

8. The array substrate according to claim 1, wherein the pixel electrode is formed of a material selected from the group consisting of indium tin oxide, indium zinc oxide, and aluminum zinc oxide.

9. A method of manufacturing a thin film transistor (TFT) array substrate for a liquid crystal display (LCD) device assembled with the array substrate and a color filter substrate having a liquid crystal layer interposed therebetween, comprising the steps of:
    depositing and patterning a gate metal film on a substrate so as to form a gate line, a common electrode, and a light blocking bar, a part of the gate line serving as a gate electrode of a thin film transistor;
    depositing a gate insulating material film and an active material film sequentially and patterning the active material film so as to form an active layer of the thin film transistor
    depositing and patterning a second metal film so as to form a data line, a source electrode, and a drain electrode of the thin film transistor, wherein the source electrode and the drain electrode are spaced apart from each other and are in contact with both ends of the active layer respectively;
    depositing and patterning a passivation material film so as to formed a passivation layer via hole above the drain electrode; and
    depositing and patterning a pixel electrode film so as to form a pixel electrode that is connected with the drain electrode via the passivation layer via hole and is overlapped with the common electrode to form a storage capacitor, and wherein the passivation layer via hole is formed over the common electrode;
    wherein the light blocking bar is formed at the periphery of the pixel electrode, and the gate line, the common electrode, and the light blocking bars are formed of the same material in the same process.

10. The method according to claim 9, wherein the light blocking bar and the common electrode are connected as an integrated structure.

11. The method according to claim 10, wherein the light blocking bar extends parallel to the gate line or the data line.

12. The method according to claim 10, wherein the light blocking bar comprises:
    a first light blocking bar parallel to the gate line; and
    a second light blocking bar parallel to the data line.

13. The method according to claim 12, wherein the first light blocking bar and the second light blocking bar are connected to form a closed structure.

14. The method according to claim 9, wherein the gate line, the data line, the source electrode and the drain electrode of the thin film transistor, the common electrode and the light blocking bars are formed of a material selected from the group consisting of aluminum, chromium, tungsten, tantalum, titanium, molybdenum, aluminum-nickel or a combination thereof, and are formed in a structure selected from in a single layer structure or a multi-layer structure.

15. The method according to claim 9, wherein a part of the pixel electrode is formed over the gate line so as to form a fusion portion.

16. The method according to claim 9, wherein the pixel electrode is formed of a material selected from the group consisting of indium tin oxide, indium zinc oxide and aluminum zinc oxide.

\* \* \* \* \*